United States Patent
Lee et al.

(10) Patent No.: US 7,521,812 B2
(45) Date of Patent: Apr. 21, 2009

(54) METHOD OF WIRE BONDING OVER ACTIVE AREA OF A SEMICONDUCTOR CIRCUIT

(75) Inventors: Jin-Yuan Lee, Hsin-Chu (CN);
Ying-Chih Chen, Yung-Kong (CN);
Mou-Shiung Lin, Hsin-Chu (CN)

(73) Assignee: Megica Corp., Hsinchu (TW)

( * ) Notice: Subject to any disclaimer, the term of this patent is extended or adjusted under 35 U.S.C. 154(b) by 19 days.

(21) Appl. No.: 11/678,598

(22) Filed: Feb. 25, 2007

(65) Prior Publication Data
US 2007/0164452 A1 Jul. 19, 2007

Related U.S. Application Data

(63) Continuation of application No. 10/434,142, filed on May 8, 2003.

(51) Int. Cl.
*H01L 23/485* (2006.01)
*H01L 23/49* (2006.01)

(52) U.S. Cl. ............ 257/784; 257/E23.02; 257/E23.024

(58) Field of Classification Search ......... 257/750–766, 257/784, E23.02, E23.024
See application file for complete search history.

(56) References Cited

U.S. PATENT DOCUMENTS

| 4,636,832 | A | | 1/1987 | Abe et al. |
| 4,927,505 | A | * | 5/1990 | Sharma et al. .............. 205/123 |
| 5,108,950 | A | | 4/1992 | Wakabayashi et al. |
| 5,384,486 | A | | 1/1995 | Konno |
| 5,384,488 | A | | 1/1995 | Golshan et al. |
| 5,659,201 | A | | 8/1997 | Wollesen |
| 5,665,639 | A | | 9/1997 | Seppala et al. |
| 5,719,448 | A | | 2/1998 | Ichikawa |
| 5,751,065 | A | | 5/1998 | Chittipeddi et al. |
| 5,800,555 | A | | 9/1998 | Gray, III |
| 5,969,424 | A | | 10/1999 | Matsuki et al. |
| 6,080,526 | A | | 6/2000 | Yang et al. |
| 6,184,121 | B1 | | 2/2001 | Buchwalter et al. |

(Continued)

FOREIGN PATENT DOCUMENTS

JP 58028858 2/1983

OTHER PUBLICATIONS

Spiral Inductors and Transmission Lines in Silicon Technology using Copper-Damoscene Inter connects and Low-Loss Substrates, by Joachim N. Burghartz et al., XP-000/04848 IEEE 1997, Theary and Technigues, vol. 45, No. 10, Oct. 1997, pp. 1961-1968.

(Continued)

*Primary Examiner*—Marcos D. Pizarro (57) ABSTRACT

A method and structure are provided to enable wire bond connections over active and/or passive devices and/or low-k dielectrics, formed on an Integrated Circuit die. A semiconductor substrate having active and/or passive devices is provided, with interconnect metallization formed over the active and/or passive devices. A passivation layer formed over the interconnect metallization is provided, wherein openings are formed in the passivation layer to an upper metal layer of the interconnect metallization. Compliant metal bond pads are formed over the passivation layer, wherein the compliant metal bond pads are connected through the openings to the upper metal layer, and wherein the compliant metal bond pads are formed substantially over the active and/or passive devices. The compliant metal bond pads may be formed of a composite metal structure.

13 Claims, 6 Drawing Sheets

U.S. PATENT DOCUMENTS

| | | | |
|---|---|---|---|
| 6,187,680 B1 | 2/2001 | Costrini et al. | |
| 6,204,074 B1 | 3/2001 | Bertolet et al. | |
| 6,229,221 B1 | 5/2001 | Kloen et al. | |
| 6,303,423 B1 | 10/2001 | Lin | |
| 6,376,353 B1 | 4/2002 | Zhou et al. | |
| 6,383,916 B1 * | 5/2002 | Lin | 438/637 |
| 6,465,879 B1 | 10/2002 | Taguchi | |
| 6,544,880 B1 | 4/2003 | Akram | |
| 6,560,862 B1 | 5/2003 | Chen et al. | |
| 6,593,649 B1 | 7/2003 | Lin et al. | |
| 6,649,509 B1 | 11/2003 | Lin et al. | |
| 6,706,622 B1 | 3/2004 | McCormick | |
| 6,710,460 B2 | 3/2004 | Morozumi | |
| 6,730,982 B2 | 5/2004 | Barth et al. | |
| 6,756,295 B2 | 6/2004 | Lin et al. | |
| 6,762,115 B2 | 7/2004 | Lin et al. | |
| 6,800,555 B2 | 10/2004 | Test et al. | |
| 2001/0051426 A1 * | 12/2001 | Pozder et al. | 438/666 |
| 2002/0000671 A1 * | 1/2002 | Zuniga et al. | 257/773 |
| 2002/0068385 A1 | 6/2002 | Ma et al. | |
| 2003/0087130 A1 | 5/2003 | Sugawara | |
| 2004/0166659 A1 | 8/2004 | Lin et al. | |

OTHER PUBLICATIONS

The Effects of a Ground Shield on Spiral Inductors Fabricated in a Silicon Bipolar Technology, IEEE Berm 9.1 by seang—moyiun et al., pp. 157-160, 2000IEEE.

* cited by examiner

METHOD OF WIRE BONDING OVER ACTIVE AREA OF A SEMICONDUCTOR CIRCUIT

This application is a continuation application of Ser. No. 10/434,142, filed on May 8, 2003, which claims priority to Provisional Patent Application Ser. No. 60/418,551, filed on Oct. 15, 2002, both of which are herein incorporated by reference in their entirety.

RELATED PATENT APPLICATIONS

This application is related to (MEG00-003), filed on May 7, 2001, Ser. No. 09/858,528, now issued as U.S. Pat. No. 6,593,649 and to (MEG02-009), filed on May 8, 2003, Ser. No. 10/434524, both assigned (under a joint Assignment) to the Assignee of the instant invention.

BACKGROUND OF THE INVENTION (1) Field of the Invention

The invention relates to the fabrication of integrated circuit devices, and more particularly to the fabrication of wire bond pads over underlying active devices, passive devices and/or weak dielectric layers.

(2) Background of the Invention

Performance characteristics of semiconductor devices are typically improved by reducing device dimensions, resulting in increased device densities and increased device packaging densities. This increase in device density places increased requirements on the interconnection of semiconductor devices, which are addressed by the packaging of semiconductor devices. One of the key considerations in the package design is the accessibility of the semiconductor device or the Input/Output (I/O) capability of the package after one or more devices have been mounted in the package.

In a typical semiconductor device package, the semiconductor die can be mounted or positioned in the package and can further be connected to interconnect lines of the substrate by bond wires or solder bumps. For this purpose the semiconductor die is provided with pads (bond pads) that are, typically mounted around the perimeter of the die, and are located such as not to be formed over regions containing active or passive devices.

One reason the bond pads are not formed over the active or passive devices is related to the thermal and/or mechanical stresses that occur during the wire bonding process. During wirebonding, wires are connected from the bond pads to a supporting circuit board or to other means of interconnections.

The semiconductor industry has recently turned increasingly to low dielectric-constant (or low-k) materials for inter-metal dielectrics. However, such materials typically have lower mechanical strength than traditional insulating materials and are thus also susceptible to damage by wire bonding.

U.S. Pat. No. 4,636,832 (Abe et al.) describes a method of forming a bond pad over an active area, using a silicon layer for stress reduction.

U.S. Pat. No. 5,751,065 (Chittipeddi et al.) discloses a method of providing an integrated circuit with active devices under the bond pads, and uses metal for stress relief.

U.S. Pat. No. 6,384,486 (Zuniga et al.) shows a method of forming an integrated circuit under a contact pad, also using a metal layer for stress absorption.

U.S. Pat. No. 6,229,221 (Kloen et al.) describes forming a wire bond to a bond pad formed over active devices, where the bond pad and passivation must have specified thickness and be substantially free from interruptions under the wire bonding region.

SUMMARY OF THE INVENTION

A principal objective of the invention is to provide a method and structure to enable wire bond connections over device regions of a semiconductor die, whereby damage to underlying layers of dielectric, active and/or passive devices is avoided.

Another objective of the invention is to reduce semiconductor die size, and thus manufacturing cost, for integrated circuits to be connected to next level packaging by wire bonding.

In accordance with the objectives of the invention, a new method and structure for enabling wire bond connections over active regions of an Integrated Circuit die is provided. A semiconductor die, on which are formed active and/or passive devices, has at least one interconnect metal layer having at least one top level metal contact, and a passivation layer over the interconnect metal layer, wherein the passivation layer comprises at least one opening through which is exposed the top level metal contact point. A compliant metal bond pad is formed over the passivation layer, connected to the top level metal contact through the opening.

Various types, configurations or designs of openings through the layer of passivation are provided. Optionally, a layer of compliant material is formed between the compliant metal bond pad and passivation. Wire bonding may later be performed to the bond pad.

DESCRIPTION OF THE PREFERRED EMBODIMENTS

Conventional wire bonding methods and methods of I/O interconnect can result in damage being inflicted on underlying layers of dielectric, such as those layers of dielectric over which the interconnecting bond pads are formed. Furthermore, common industry practice has been to locate active devices away from the areas under bond pads, to avoid damage to the devices during wire bonding. This results in a significant increase in die size, causing extra manufacturing cost.

The invention provides a method which allows wire bonding connections to a semiconductor die to be made over active and/or passive devices, without damage to the devices or to intervening dielectric layers.

Conventional wire bond connections are provided along the periphery of an Integrated Circuit (IC). The bond pads are laterally displaced from the active device region in order to avoid the negative impact of mechanical stress that is introduced to and through underlying layers of dielectric during and as a result of wire bonding.

Figure 1A:
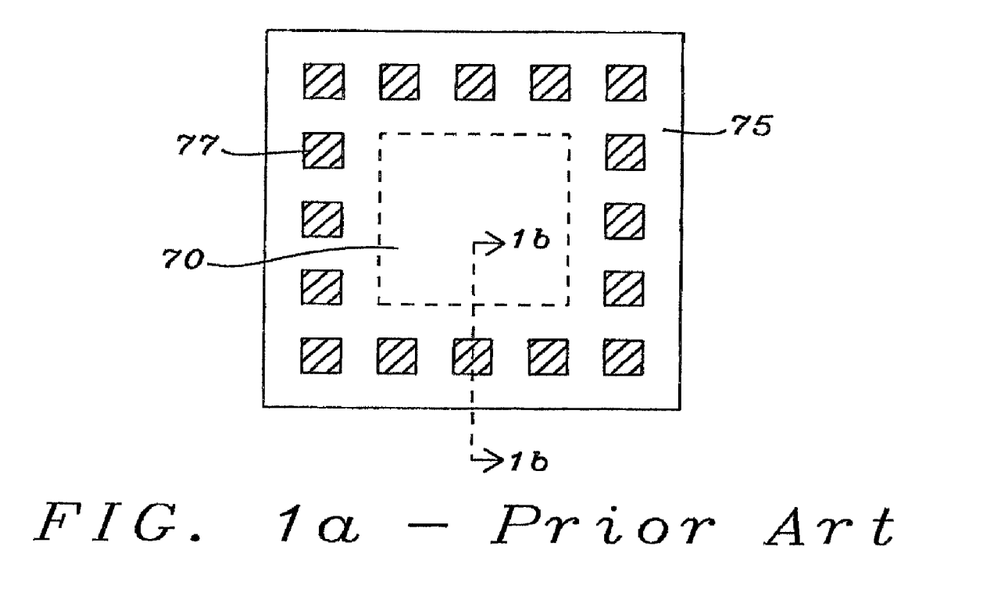
FIGS. 1a and 1b show conventional methods of creating wire bond connections to an Integrated Circuit die.
Figure 1B:
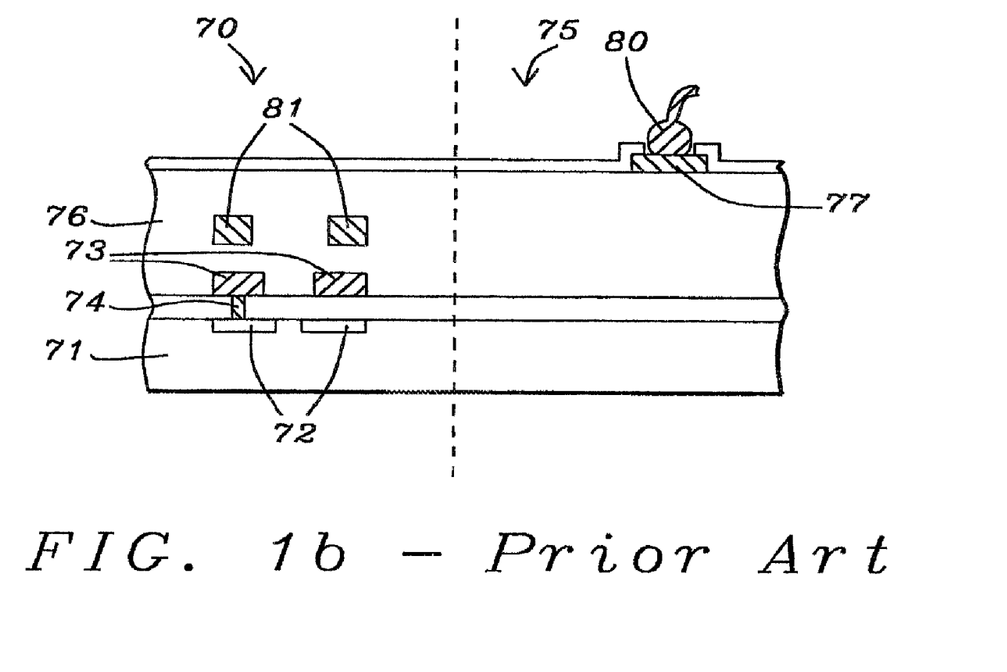

This is illustrated using FIGS. 1a and 1b, whereby FIG. 1a highlights a first region 70 in which active and/or passive devices are formed. The first region 70 is separate from a second region 75, over which bond pads 77 are formed. The top view shown in FIG. 1a is shown in cross section in FIG. 1b, wherein specifically are highlighted a substrate 71, in or over the surface of which active and/or passive devices 72 have been created. A first layer 73 of interconnect metal is shown, which is typically connected at one or more points by contacts 74, to devices 72. One or more overlying layers 81 of interconnect metal are formed, in one or more layers of intermetal dielectric 76, with a top metal layer from which bond pads 77 are formed. Bond pad 77 and wire bond 80 are formed in second region 75, and are laterally separated from above the first region 70. As shown in FIGS. 1a and 1b, no active and/or passive devices are formed underlying the bond pad 77.

This requirement, of laterally separating wire bonding pads 77 from underlying active and/or passive devices 72 created in or over a semiconductor die, as highlighted in FIGS. 1a and 1b, causes the need for a significant increase in die size since the area 70 is not available at the die top surface for wire bond connections.

The invention will now be described in detail using FIGS. 2-8c.

Figure 2:
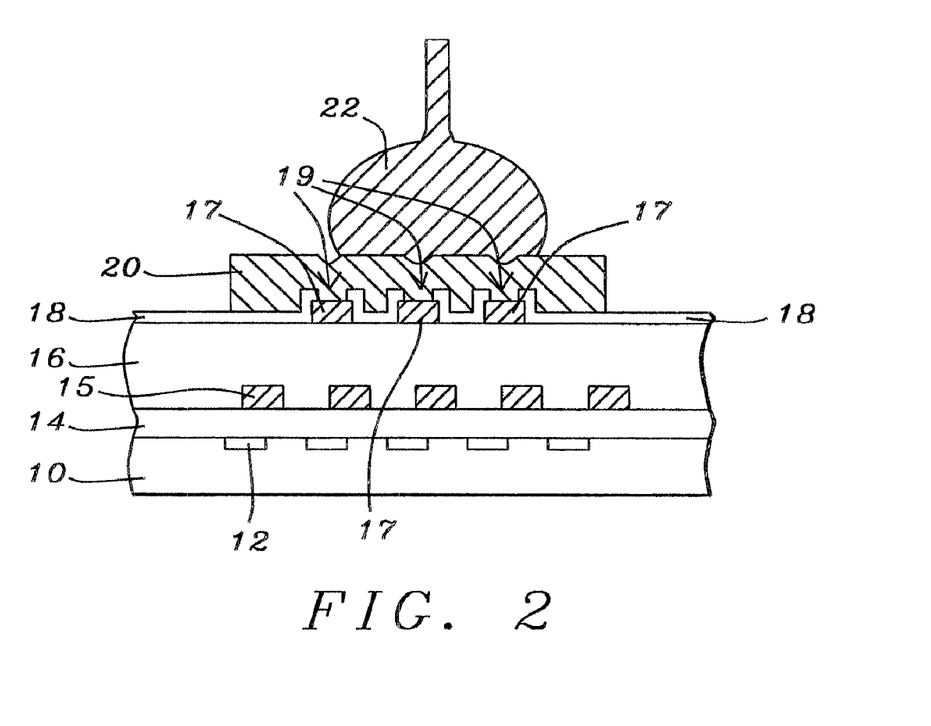
FIG. 2 is a cross-sectional drawing of the invention for a compliant metal to which a wire bond connection has been made.

Referring first specifically to the cross section that is shown in FIG. 2, the following elements are shown:
   10, a substrate in or over which active semiconductor devices have been created (alternately, or in addition to, passive elements such as metal lines, capacitors, resistors, inductors and the like)
   12, a representative sample of the semiconductor devices that have been created in or over substrate 10; conductive points of electrical contact to devices 12 (not shown) are provided
   14, a first layer of interlevel dielectric
   15, metal interconnections in one or more layers
   16, intermetal dielectric
   17, contact pads formed from the top metal layer of interconnect metal
   18, a layer of passivation deposited over the layer 16 of intermetal dielectric and contact pads 17
   19, openings created through the layer 18 of passivation for access to contact pads 17
   20, of significant importance to the invention, a layer of compliant metal formed over passivation layer 18
   22, a wire bond connection provided to layer 20 of complaint metal.

The preferred method for the creation of wire bonding pad 20 comprises the following steps:
   1. barrier layer sputtering
   2. seed layer sputtering
   3. a photo-lithographic process to define an opening for the bulk metal
   4. electroplating the bulk metal
   5. photoresist strip
   6. seed layer metal etch
   7. barrier layer metal etch.

The barrier layer is formed to a preferred thickness of about 3000 Angstroms, and is preferably formed of TiW (titanium tungsten). The seed layer is formed to a preferred thickness of about 1000 Angstroms and is preferably Au (gold). The photoresist used in step 3. above is preferably formed to a thickness of between about 10 and 12 µm.

Compliant metal 20 is preferred to be created to a minimum thickness of about 1.0 µm, but is preferably more than 2 µm thick, and is preferably formed of Au. More generally, the thickness of the compliant metal 20 should be based on the amount of energy the pad needs to absorb during wirebonding. The thicker the compliant metal pad thickness, the more energy the pad will be able to absorb.

Figure 3:
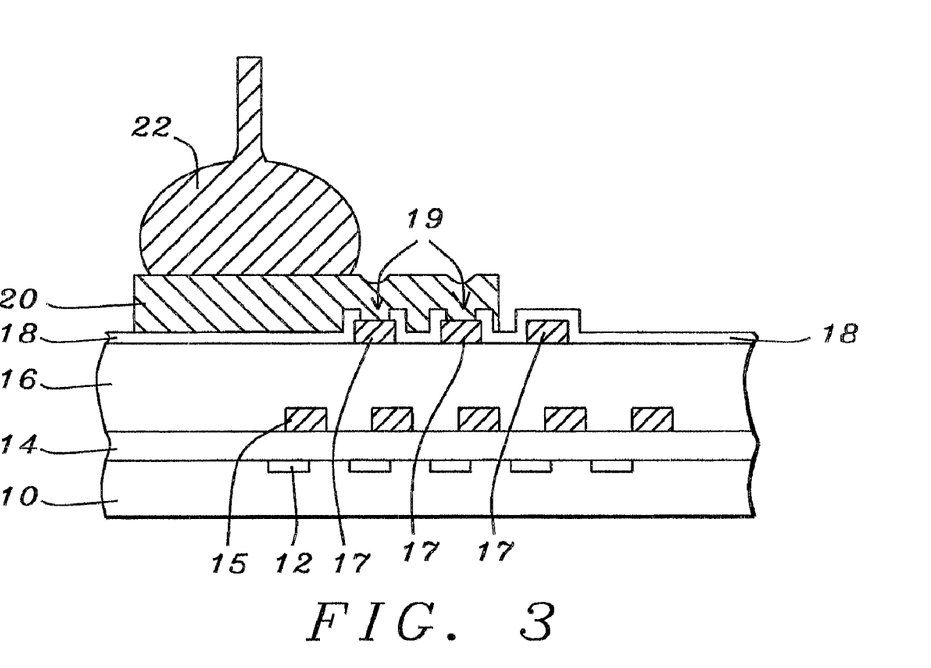
FIG. 3 shows a cross section of a second embodiment of the invention for compliant metal to which a wire bond connection has been made.

The small passivation openings 19 in FIGS. 2 and 3, have a minimum cross section of about 0.1 µm, but are preferably at least 0.5 µm. Passivation openings 19 may be formed over only one of the contact pads 17, but preferably some or all contact pads 17 under wirebond pad 20 have passivation openings 19 formed thereover, as shown in FIG. 2.

Referring now to FIG. 3, in an alternative embodiment the wire bonding region, to which wire bond 22 attaches, is displaced laterally with respect to one or more of the openings 19 that has been provided through the passivation layer 18. This allows for an offset of the wire bond 22 with respect to the passivation openings, providing additional flexibility in positioning the wire bond connection.

Figure 4A:
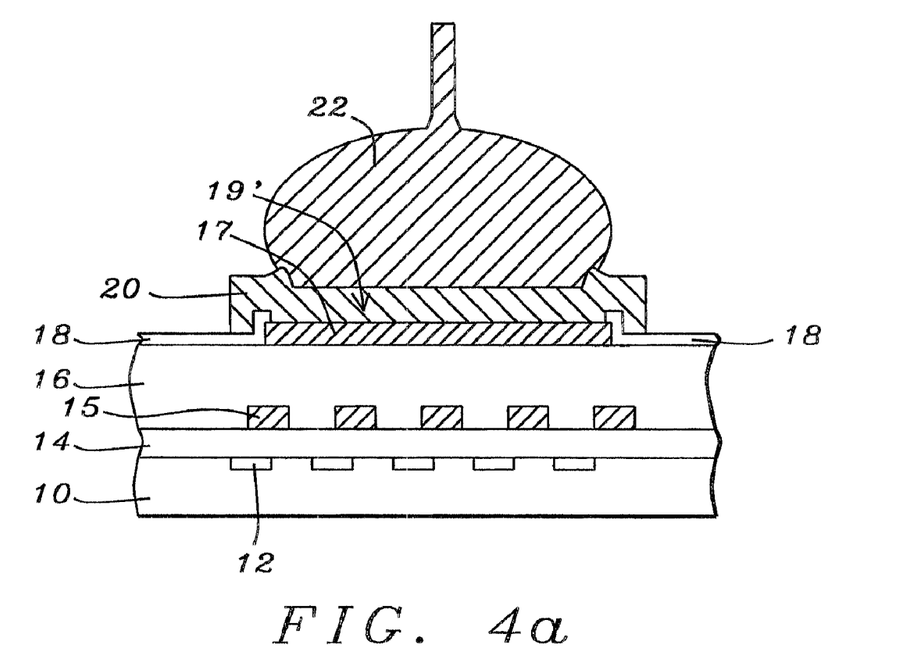
FIGS. 4a and 4b show a cross sections of a third embodiment of invention showing compliant metal to which a wire bond connection has been made.

With reference to FIG. 4a, another embodiment is shown providing additional flexibility of providing wire bond connections to a semiconductor device, by providing a larger contact pad 17. By creating a large opening 19' through the passivation layer 18, the layer 20 of compliant metal contacts the top layer 17 of metal over a larger surface area, thus decreasing the interconnect series resistance of the bond pad/contact pad connection.

The large passivation opening 19' to contact pad 17, shown in FIG. 4a, has a width of between about 40 µm and 100 µm.

Figure 4B:
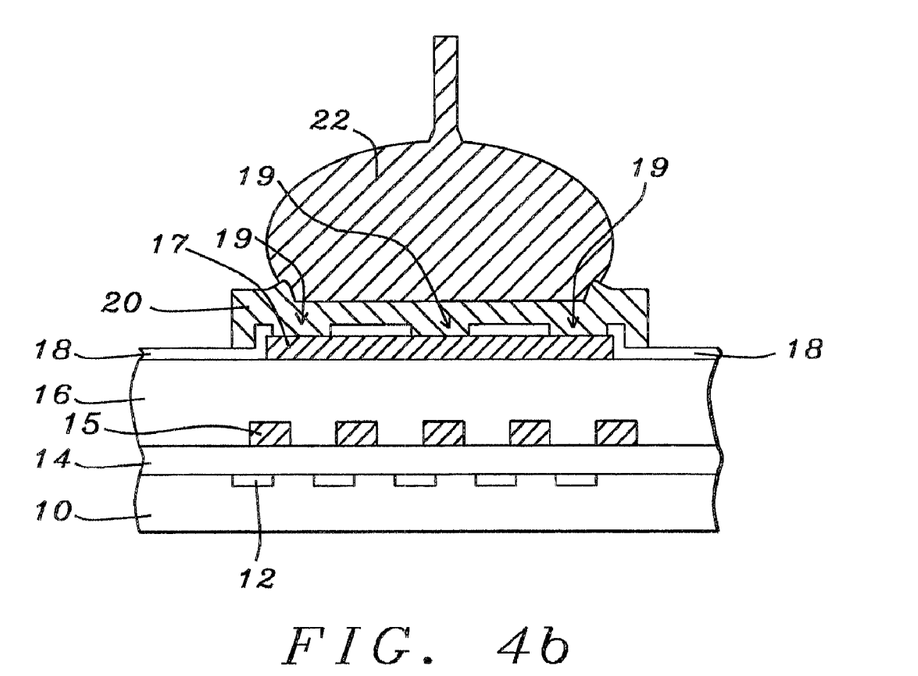

Yet another embodiment of the invention is shown in FIG. 4b, in which a large contact pad 17 is used, but with multiple openings 19 through the passivation layer 18, which results in improved planarity of the top surface of bond pad 20.

Figure 5A:
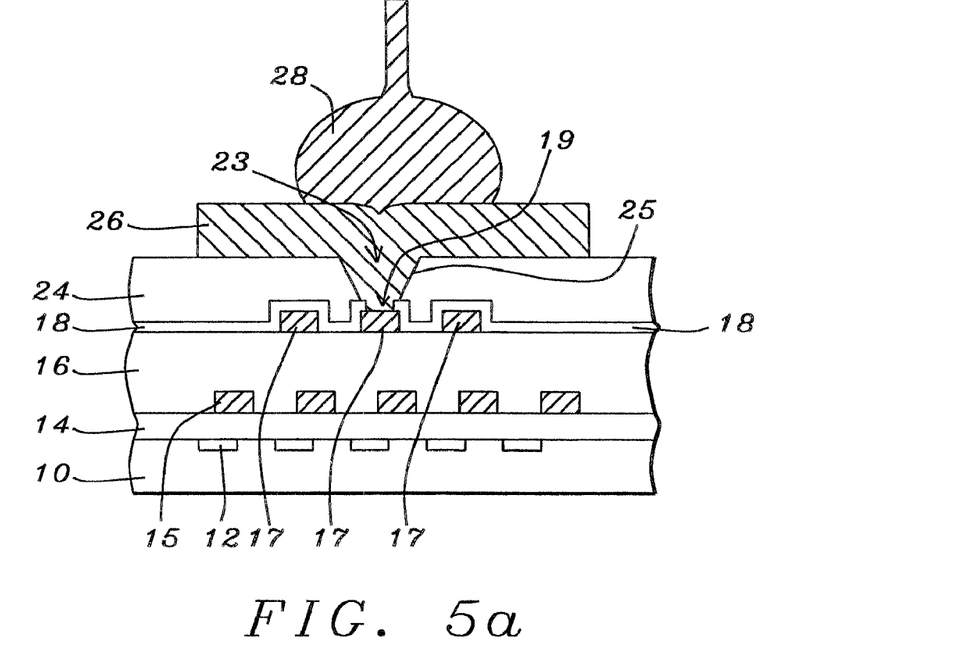
FIGS. 5a-5c show cross sections of a fourth embodiment of the invention, for a compliant material over which a layer of pad metal has been created, a wire bond connection has been made to the layer of pad metal.

In order to further enhance absorption of bonding stresses, the invention provides for, in another alternative embodiment as shown in FIG. 5a, a layer 24 of a compliant post-passivation dielectric material, under compliant metal 26. This compliant buffer layer 24 is preferably an organic material such as polyimide, benzocyclobutene (BCB) or the like, and further assists in preventing damage to underlying dielectric layer(s) 16 and active/passive devices 12. Other polymer materials that may be used for layer 24 include elastomers such as silicone, or parylene. Compliant layer 24 is typically deposited by spin-on techniques.

Opening 23 is created through the compliant post-passivation dielectric 24, and extends to passivation opening 19, providing access to top level contact point 17. The opening may have substantially vertical sidewalls 25, however the sidewalls are preferably sloped as shown in FIG. 5a. Compliant post-passivation dielectric 24, such as polyimide, is spun on and exposed and developed to have vertical sidewalls, however the subsequent curing process causes the sidewalls to have the desired slope.

The sidewall slope 25 may have an angle α of 45 degrees or more, and is typically between about 50 and 60 degrees. It may be possible to form the sidewalls with an angle as small as 20 degrees.

As described earlier, the preferred method for the creation of bond pad 26 is electroplating. Processing conditions applied for the embodiment of FIG. 5a are as follows:

1. barrier layer metal sputtering
2. seed metal sputtering
3. photo-lithographic process
4. electroplating
5. photoresist strip
6. seed metal etching, and
7. barrier metal etching.

Layer 26 is created to a preferred minimum thickness of about 1 μm, with gold the preferred material.

The preferred method for the creation of the compliant buffer layer 24 of dielectric is spin coating, with layer 24 preferably created to a minimum thickness of about 2 μm. The preferred deposition processing steps for the creation of the buffer layer 24 are the following:

1. spin-coating of photo-sensitive material
2. photo lithographic exposure and development, and
3. curing.

Alternately, compliant buffer layer 24 may be formed by screen printing, as is known in the art, a layer of polymer, such as polyimide or BCB, and then curing the layer.

Figure 5B:
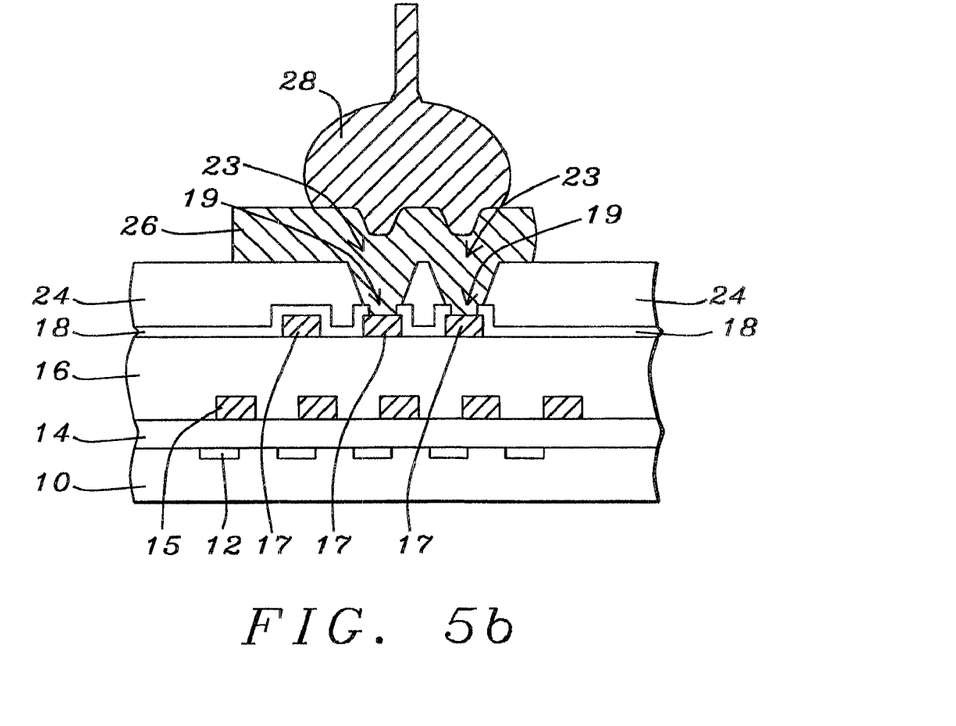

FIG. 5b shows an alternative to the FIG. 5a structure, in which multiple openings in the compliant dielectric layer 24 are formed, to connect wirebond pad 26 through multiple passivation openings 19 to multiple contact pads 17.

Figure 5C:
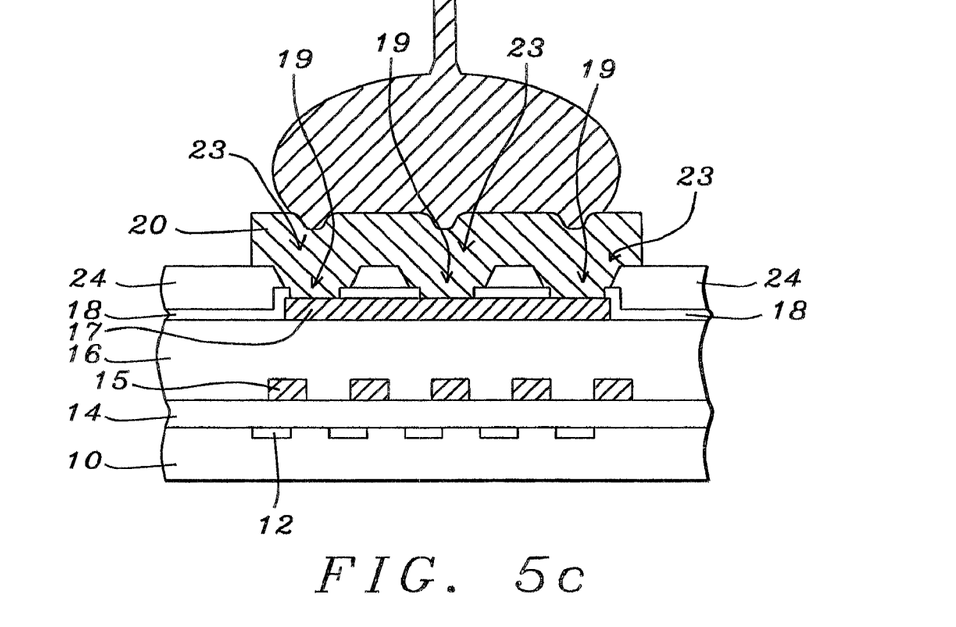

FIG. 5c shows another alternative to the FIG. 5a structure, in which multiple openings in the compliant dielectric layer 24 are formed, to connect wirebond pad 26 through multiple passivation openings 19 to a single, large contact pad 17.

Figure 6:
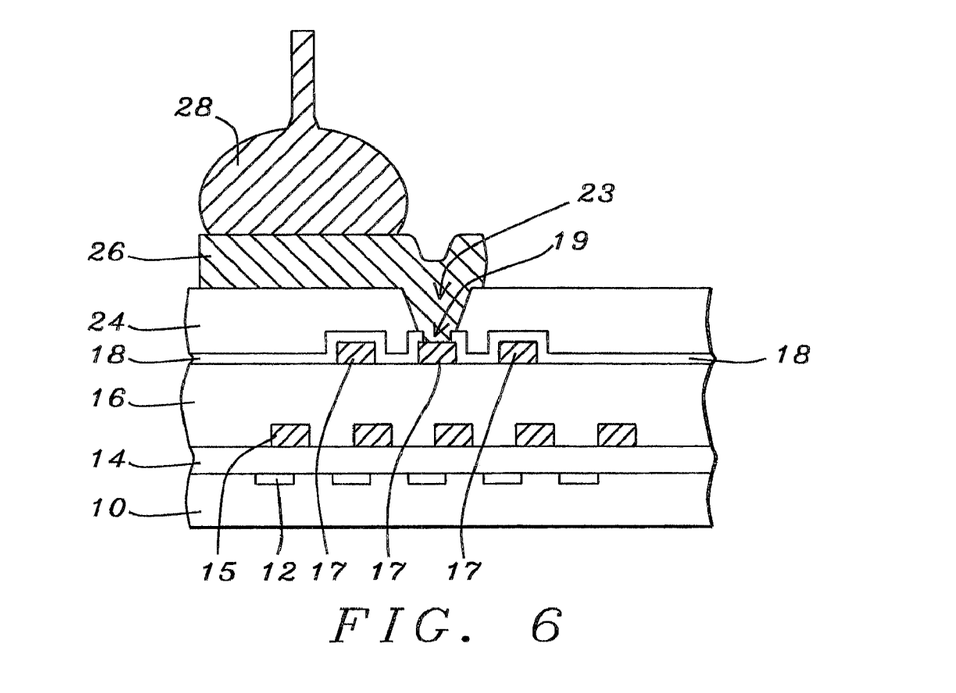
FIG. 6 shows a cross section of a fifth embodiment of the invention, for a compliant material over which a layer of pad metal has been created, a wire bond connection has been made to the layer of pad metal.

As yet a further extension, as shown in FIG. 6, the invention provides for offsetting the location of the wire bond 28 connection with respect to the connection(s) to contact pad(s) 17.

It is clear that the invention lends itself to numerous variations in the application of the layer of compliant metal and compliant post-passivation dielectric material. The examples shown using FIGS. 2 through 6 have shown only two layers of overlying interconnect traces. It is clear that the invention is not limited to two layers of interconnect metal but can be equally applied with any number of such layers.

As noted earlier, the invention is not limited to one opening created through a protective layer of passivation. The invention is also not limited as to the location of the one or more openings that are created through the layer of passivation. What is critical to the invention is the application of a layer of compliant material, which serves as a buffer between active and/or passive devices and contact pads to which wire bond connections are to be provided.

Specifically and relating to the above comments it can be realized that, in the cross section shown in FIG. 3, the off-set of the wire bond 22 can be provided laterally in either direction with respect to the contact point 17. Also and still specifically referring to the cross section of FIG. 3, the opening 19 through the layer 18 of passivation can be extended to two or more openings, each of the openings providing access to points 17 of top level metal over the surface of the layer 16 of intermetal dielectric.

The cross sections that are shown in FIGS. 2 and 3 apply to the creation of small contact pads (compared to conventional bond pads) for which small vias are created through the layer 18 of passivation, while the cross section that is shown in FIG. 4 applies to the creation of a large contact pad for which a large via is created through the passivation layer 18.

An experiment was performed in which the structure depicted in FIG. 2 was formed, using 4 μm thick electroplated gold as the compliant metal 20, and Fluorinated Silicate Glass (FSG) as the intermetal dielectric 16. After wire bonding, no damage to the intermetal dielectric was observed.

Referring now to FIGS. 7 and 8a-8c, additional detail will be discussed with regard to materials and methods of forming the wirebond pad of the invention.

Passivation layer 18 is typically formed of an inorganic material. Typically, this comprises silicon oxide at about 0.5 μm thick over which is formed silicon nitride at about 0.7 μm thick. Other materials and thicknesses, as are known in the art, may be used. The passivation layer protects underlying active and/or passive devices from the penetration of mobile ions, transition metals, moisture, and other contamination.

Figure 7:
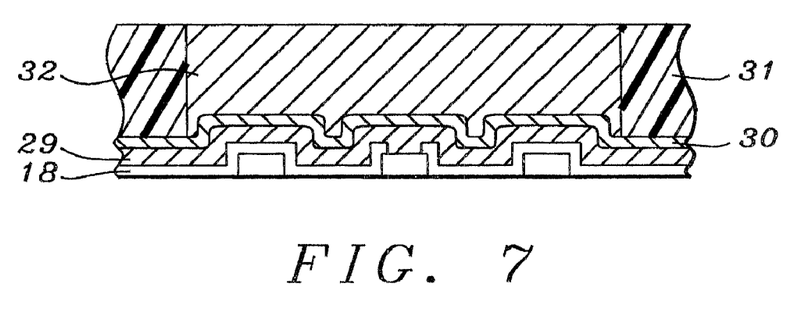
FIG. 7 shows a cross section of compliant metal.

In one embodiment of the invention, as shown in FIG. 7, a glue/barrier layer 29 is deposited over passivation layer 18. The glue/barrier layer 29 preferably comprises Ti, Cr (chromium), TiW or TiN (titanium nitride). The preferred method for the creation of glue/barrier layer 29 is sputtering.

An electroplating seed layer 30 is formed over the glue/barrier layer 29, preferably by sputtering Au to a thickness of about 1000 Angstroms.

Bondpad layer 32, of electroplated soft Au, is formed over the seed layer, using a photolithographic process as earlier described.

The Au bondpad layer 32, shown in FIG. 7, has the following characteristics:
- a hardness range of less than about 150 Hv (Vickers Hardness), whereby softer Au is preferred, since softer Au is better suited for stress absorption during wire bond formation
- an Au purity larger than about 97%, and
- a thickness larger than about 1 μm, since a thickness less than about 1 μm does not provide adequate stress absorption.

Figure 8A:
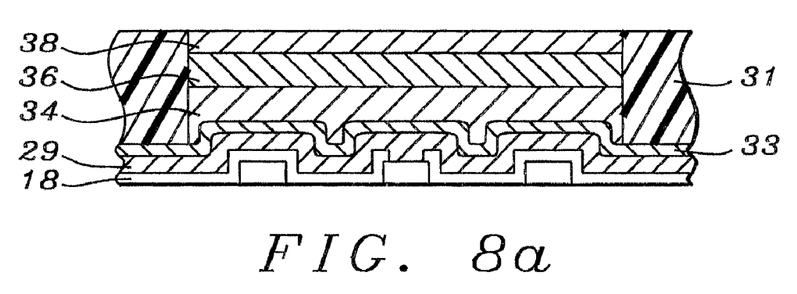
FIGS. 8a through 8c show layers of material that can be used to form compliant metal.
Figure 8B:
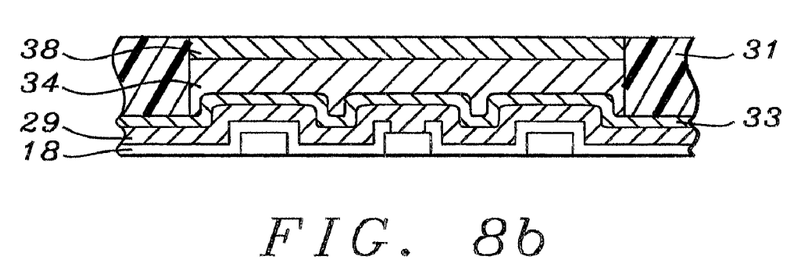
Figure 8C:
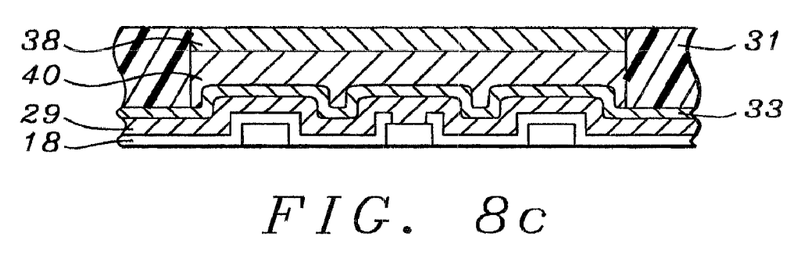

Referring now to FIGS. 8a through 8c, three further embodiments of the invention are shown, in which a composite metal system is used to form the compliant metal pad.

In all three embodiments, a glue/barrier layer 29 is deposited over passivation layer 18. Layer 29 preferably comprises Ti or Cr, formed to a preferable thickness of about 500 Angstroms. A seed layer 33 is formed over the barrier 29, and preferably comprises sputtered Cu, formed to a preferable thickness of about 5000 Angstroms.

Referring now specifically to FIG. 8a, a composite metal system 34/36/38 is shown, preferably comprising electroplated Cu/Ni/Au, respectively. The bottom layer 34 of Cu forms a bulk conduction layer, and is preferred to have a thickness larger than about 1 μm. Center layer 36 of Ni is used as a diffusion barrier, and is preferably formed to a thickness of between about 1 and 5 microns. The top Au layer 38, is wire-bondable, and has a preferred thickness of at least 0.1 micron. Alternately, the top wire bondable layer may be aluminum (Al).

In the next embodiment, as shown in FIG. 8b, a two-metal system is used. A first bulk conduction layer 34, preferably comprising Cu, is formed over the seed layer 33, and is preferably formed to a thickness of greater than about 1 micron. The second layer 38, for wire bonding purposes, is formed over layer 34, and preferably comprises Au of 0.1 micron, or Al.

In the embodiment shown in FIG. 8c, an electroplated solder 40 is used as the bulk conduction metal, with Au (or Al) layer 38 used for wirebonding. The electroplated solder may comprise Pb-alloy, Sn, Sn-alloy, or a lead-free solder such as AgSn alloy or AgCuSn alloy. A seed layer 33 preferably comprises Cu or Ni.

In the above embodiments of FIGS. 7 and 8a-8c, the compliant metal bond pads are formed as follows. A semiconductor wafer having top contact pads exposed through a layer of passivation 18 is provided. The glue/barrier layer 29 and electroplating seed layer 33 are deposited, typically by sputtering. Next, the wafer is coated with a layer of photoresist 31 having a thickness of less than 12 microns, with bond pad openings patterned by photolithography, as is known in the semiconductor art. Electroplating is then performed for the various subsequent metal layers shown in these Figures, including the top wire-bondable layer 38 of gold. Alternatively, electroless plating may be used to form wire-bondable layer 38 to a thickness of as little as 100 Angstroms. A gold layer 32 with a thickness of less than 12 microns may be electroplated on the seed layer 30 exposed by the opening in the photoresist layer 31, as shown in FIG. 7. The photoresist 31 is then stripped. The seed layer 33 and glue/barrier 29 are etched using the bond pad as a mask, to complete the structure, which is now ready for wire bonding.

For the layers shown in cross section in FIGS. 8a-8c, the Following preferred thicknesses apply:

the layer of Cu 34 is preferred to have a thickness larger than about 1 µm the diffusion layer 36 of Ni is preferred to have a thickness larger than about 0.5 µm the wirebondable Au layer 38 is preferred to have a thickness larger than about 100 Angstroms the layer of Pb-alloy, sn or Sn-alloy 40 is preferred to have a thickness larger than about 1 µm.

Further, with the layer of Pb-alloy, Sn or Sn-alloy, as shown in the cross section of FIG. 8c, additional composite layers such as a layer 34 (of Cu) or a layer 36 (of Ni) can be applied between layer 40 and the glue/barrier layer 29.

To adjust the hardness of the Au layer, the Au layer is annealed at a temperature of between about 120° C. and 350° C., resulting in a hardness of between about 150 and 15 HV (the higher hardness corresponding to a lower annealing temperature, a lower hardness corresponding to a higher annealing temperature). A preferred annealing temperature is about 270° C., which results in a hardness of about 50 Hv. Additionally, annealing may be performed in an $N_2$ ambient.

The compliant layer 20, as shown in the cross section of FIG. 1, may also be used to form low resistance power and ground planes, and/or for signal lines, above passivation layer 18, as shown in U.S. Pat. No. 6,383,916, which is herein incorporated by reference.

The metal pad of the invention is referred to as "compliant", as further described in the following. The compliant metal pad of the invention can be used to protect underlying active and/or passive devices and/or low-k dielectrics, from damage during wire bonding, because it serves as both a stress buffer (by its elasticity) and a shock wave absorber (by its ductility). To absorb mechanical energy, a material must be soft, ductile (i.e., malleable), and sufficiently thick. Being soft (i.e., having high elasticity) is not sufficient to absorb much mechanical energy. It is the process of plastic deformation that determines how much mechanical energy a material can absorb. Further, the thicker the material, the greater is the energy that can be absorbed. Metals such as Au, Cu, solder and Al are all soft, for the purposes of the invention, but Au and solder are able to absorb more mechanical energy than Cu and Al due to their ductility.

The total thickness of the compliant metal bond pads is preferred to be more than 1.5 µm., in order to sufficiently absorb bonding energy.

Low-k dielectric materials that could be used and protected from wire-bonding damage by the invention include CVD-deposited dielectrics including but not limited to polyarylene ether, polyarylene, polybenzoxazole, and spun-on dielectrics having a $Si_wC_xO_yH_z$, composition. These low-k dielectrics generally have a dielectric constant less than 3.0, but are at least less than the dielectric contant of CVD-deposited $SiO_2$, which has a dielectric constant of about 4.2.

A key advantage of the invention is the reduction in die size allowed by the placing of bond pads over the active devices, as compared to the traditional industry practice of laterally displacing the bonding regions from the active region. Further, due to the compliant nature of gold used in the bond pads of the invention, there are no restrictions on underlying interconnect metal routing.

The compliant metal bond pad of the invention advantageously provides for absorption of the bonding force during wire bonding, thus preventing damage to active circuits and/or passive devices located underneath the bond pad. This absorption of the bonding force is otherwise difficult to achieve by, for instance, conventional bond pad materials such as aluminum, which are very difficult to deposit and etch at thicknesses sufficient to absorb stress.

The optional, additional organic layer of the invention further helps in absorbing the force that is exerted during wire bonding.

The invention is particularly beneficial, by providing improved force absorption capabilities when compared with prior art methods, for deep-submicron technologies for which low-k dielectrics (which includes CVD or spun-on materials) are increasingly used.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A circuit component comprising:

a semiconductor substrate;

a first active device in or over said semiconductor substrate;

a first dielectric layer over said semiconductor substrate and over said first active device;

a first interconnect metal layer over said first dielectric layer and over said semiconductor substrate;

a second dielectric layer over said first interconnect metal layer and over said first dielectric layer;

a second interconnect metal layer over said second dielectric layer;

a passivation layer on said second interconnect metal layer and over said second dielectric layer, wherein a first opening in said passivation layer is over a contact point of said second interconnect metal layer, and wherein said passivation layer comprises a nitride;

a polymer layer on said passivation layer, wherein said polymer layer has a thickness greater than 2 micrometers and greater than that of said passivation layer;

a metal pad on said polymer layer and over said first active device, wherein said metal pad is connected to said contact point through said first opening, and wherein said metal pad comprises a glue/barrier layer, a gold seed layer over said glue/barrier layer, and an electroplated gold layer having a thickness greater than 1 micrometer over said gold seed layer; and a wire bonded to said metal pad, wherein a contact between said wire and said metal pad is directly over said first active device and over said polymer layer, wherein said contact has a transverse dimension greater than that of said first opening.

2. The circuit component of claim 1, wherein said electroplated gold layer has a hardness less than 150 Hv.

3. The circuit component of claim 1, wherein said glue/barrier layer comprises a titanium-containing layer under said gold seed layer.

4. The circuit component of claim 1, wherein said glue/barrier layer comprises a titanium-tungsten-alloy layer under said gold seed layer.

5. The circuit component of claim 1, wherein said electroplated gold layer comprises a gold purity greater than 97%.

6. The circuit component of claim 1, wherein said glue/barrier layer comprises a titanium-nitride layer under said gold seed layer.

7. The circuit component of claim 1, wherein said contact is further directly over a portion of said second interconnect metal layer.

8. The circuit component of claim 1 further comprising a second active device in or over said semiconductor substrate and under said first dielectric layer, wherein said second active device comprises a portion directly under said contact point.

9. The circuit component of claim 1, wherein said polymer layer comprises polyimide.

10. The circuit component of claim1, wherein said polymer layer comprises benzocyclobutcne (BCB).

11. The circuit component of claim 1, wherein said nitride comprises silicon nitride.

12. The circuit component of claim 1, wherein a second opening in said polymer layer is over said contact point, wherein said metal pad is connected to said contact point further through said second opening.

13. The circuit component of claim 1, wherein said passivation layer further comprises an oxide under said nitride.

* * * * *